US006859109B1

(12) United States Patent
Leung et al.

(10) Patent No.: US 6,859,109 B1
(45) Date of Patent: Feb. 22, 2005

(54) DOUBLE-DATA RATE PHASE-LOCKED-LOOP WITH PHASE ALIGNERS TO REDUCE CLOCK SKEW

(75) Inventors: Gerry C. T. Leung, Hong Kong (CN); Howard C. Luong, Renton, WA (US)

(73) Assignee: Pericom Semiconductor Corp., San Jose, CA (US)

( * ) Notice: Subject to any disclaimer, the term of this patent is extended or adjusted under 35 U.S.C. 154(b) by 101 days.

(21) Appl. No.: 10/250,000

(22) Filed: May 27, 2003

(51) Int. Cl.[7] .............................................. H03B 27/00
(52) U.S. Cl. ..................... 331/46; 331/185; 331/1 A; 331/117 R; 331/117 FE; 331/167; 331/45; 327/141; 327/147; 327/150; 327/151; 327/156; 327/159
(58) Field of Search ........................ 331/1 A, 25, 45, 331/46, 117 R, 117 FE, 167; 327/141, 147, 150, 151, 156, 159; 375/376

(56) References Cited

U.S. PATENT DOCUMENTS

| | | | |
|---|---|---|---|
| 5,608,357 A | 3/1997 | Ta et al. ....................... 331/57 |
| 6,111,470 A | 8/2000 | Dufour ......................... 331/17 |
| 6,114,890 A | 9/2000 | Okajima et al. ............. 327/170 |
| 6,222,895 B1 | 4/2001 | Larsson ....................... 375/376 |
| 6,265,919 B1 | 7/2001 | Guisante et al. ............ 327/159 |
| 6,320,436 B1 | 11/2001 | Fawcett et al. .............. 327/158 |
| 6,346,838 B1 | 2/2002 | Hwang et al. ............... 327/156 |
| 6,373,301 B1 | 4/2002 | Chen et al. .................. 327/141 |
| 6,437,620 B1 | 8/2002 | Singor ......................... 327/172 |
| 6,445,234 B1 | 9/2002 | Yoon et al. .................. 327/161 |
| 6,466,069 B1 | 10/2002 | Rozenblit et al. ........... 327/157 |
| 6,466,074 B2 | 10/2002 | Vakil et al. .................. 327/295 |
| 6,469,584 B1 | 10/2002 | Eker et al. ..................... 331/11 |
| 6,476,594 B1 | 11/2002 | Roisen ...................... 324/76.54 |
| 6,476,652 B1 | 11/2002 | Lee et al. .................... 327/158 |
| 6,476,656 B2 | 11/2002 | Dally et al. ................. 327/276 |
| 6,477,657 B1 | 11/2002 | Kurd et al. .................. 713/501 |
| 6,477,688 B1 | 11/2002 | Wallace ........................ 716/10 |

OTHER PUBLICATIONS

Joo–Ho Lee, et al., "A 330 MHz low–jitter and fast–locking direct skew compensation DLL" *IEEE International Solid–State Circuits Conference,* 2000, pp. 352–353.
Saeki, T, et al., "A direct–skew–detect synchronous mirror delay for application–specific integrated circuits" *JSSC,* vol. 34, No. 3, pp. 372–379, Mar. 1999.
Wang et al., "A 500 Mb/s/pin quadruple data rate SDRAM interface using a skew cancellation technique," *IEEE JSSC,* vol. 36, No. 4, pp. 648–657 Apr. 2001.

*Primary Examiner*—Arnold Kinkead
(74) *Attorney, Agent, or Firm*—Stuart T. Auvinen

(57) ABSTRACT

A phase-locked loop (PLL) has an analog divider in the feedback path that receives either the in-phase or quadrature-phase pair of outputs from a voltage-controlled oscillator (VCO) while the other pair, 90-degree out-of-phase, of outputs from the VCO is used for the PLL output. Phases between the PLL's input and output are inherently aligned. The analog output of the analog divider is converted to a digital clock signal and applied to a cascade of digital dividers to generate a reduced feedback clock. The reduced feedback clock is applied to the D input and the digital clock signal is applied to the clock input of a pseudo D-flip-flop that drives the feedback input of a phase-frequency detector that drives the charge pump to the VCO input. Another cascade of digital dividers and pseudo D-flip-flop re-align the reference clock input to the phase-frequency detector. Analog and digital re-alignment circuits reduce internal skew.

20 Claims, 7 Drawing Sheets

DOUBLE-DATA RATE PHASE-LOCKED-LOOP WITH PHASE ALIGNERS TO REDUCE CLOCK SKEW

BACKGROUND OF INVENTION

This invention relates to phase-locked loops (PLL's), and more particularly to phase pre-alignment of clocks to the phase detector of the PLL.

Integrated circuit (IC) performance is often limited by clock generation and distribution. High-frequency synchronous systems are sensitive to clock skew. Clock skew is the phase difference between an input clock and an output clock. Clock skew should be minimized to prevent race conditions, to shorten setup time and hold time requirements, and to increase the maximum possible operating speed.

CMOS technology scaling has produced a requirement for low supply voltages to maintain device reliability with the smaller, more easily damaged devices. Employing a low supply voltage minimizes power consumption in digital circuits and extends battery life. However, it is quite challenging to design analog circuits at a supply voltage as low as 1V using conventional approaches, especially for high frequency clock generation.

Currently, clock generation is commonly based on three techniques including Delay-Locked Loops (DLLs), Synchronous Mirror Delays (SMDs) and Phase-Locked Loops (PLLs). In most cases, DLLs and SMDs provide only a fixed frequency, while PLLs can provide multiple output frequencies, which can be even higher than the input frequency.

DLLs and SMDs are composed of delay chains to perform phase adjustment and alignment. However, speed is inherently limited by the delay of individual cells and thus by the voltage supply and the process parameters. This frequency limitation can be overcome by using an LC oscillator as the core in a PLL.

FIG. 1 shows a prior-art PLL. The high-frequency output signal VCOUT of an LC voltage-controlled oscillator VCO 41 is divided down by feedback divider 58 to a lower feedback frequency. The output signal of divider 58 is applied to one of the inputs of phase-frequency detector 54 to perform phase and frequency comparison with the divided-down input clock as a reference clock applied to the other input. The reference clock REFCLK is divided by M by input divider 52.

Phase-frequency detector 54 controls charge pumps 56 to sink or source currents to loop filter 57, which increases or decreases the output voltage of loop filter 57. Loop filter 57 is used to filter out high-frequency noise from charge pumps 56 and to stabilize the closed-loop system of PLL 10.

The output voltage of loop filter 57 is applied as the control voltage to VCO 41 to control its output frequency. This negative feedback system can ensure that the output frequency of the oscillator equals the input clock frequency multiplied by dividing ratio N/M in the locked condition. The phase difference between the VCO output and input clock are not necessary zero due to the intrinsic delay in dividers 52, 58 and the mismatch due to the complementary outputs of phase-frequency detector 54 and current mismatch in the charge pumps 56.

What is desired is a better-aligned PLL. A PLL with lower internal skew is desirable. A high-frequency PLL that can operate with low supply voltages is desired.

DETAILED DESCRIPTION

The present invention relates to an improvement in phase-locked loops (PLL's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that some clock generators have an output frequency that is a multiple of the input frequency, such as when the output is double the input frequency. The inventors further realized that both analog phase alignment and frequency dividing and digital phase alignment and frequency dividing can be used for better phase alignment and reduced skew. A combination of analog and digital phase-aligning circuits can reduce skew.

Outputs of the analog VCO are applied to the first divider in the feedback path, which is an analog circuit. The analog output of this first divider is amplified to generate digital signals that then are further divided by a cascade of digital dividers. The final output of the digital dividers is re-aligned by the initial digital signal and applied to the phase-frequency detector. The reference clock is also divided by a cascade of digital dividers and re-aligned by the reference clock before being applied to the phase-frequency detector. Thus the phase-frequency detector operates at a lower frequency, and has both its inputs pre-aligned.

An output pair of a VCO with in-phase and quadrature-phase outputs controls the divider in the feedback. The other output pair which is 90 degrees out of phase is simultaneously used as the PLL output to align the phases between the PLL's input and output.

Figure 1:
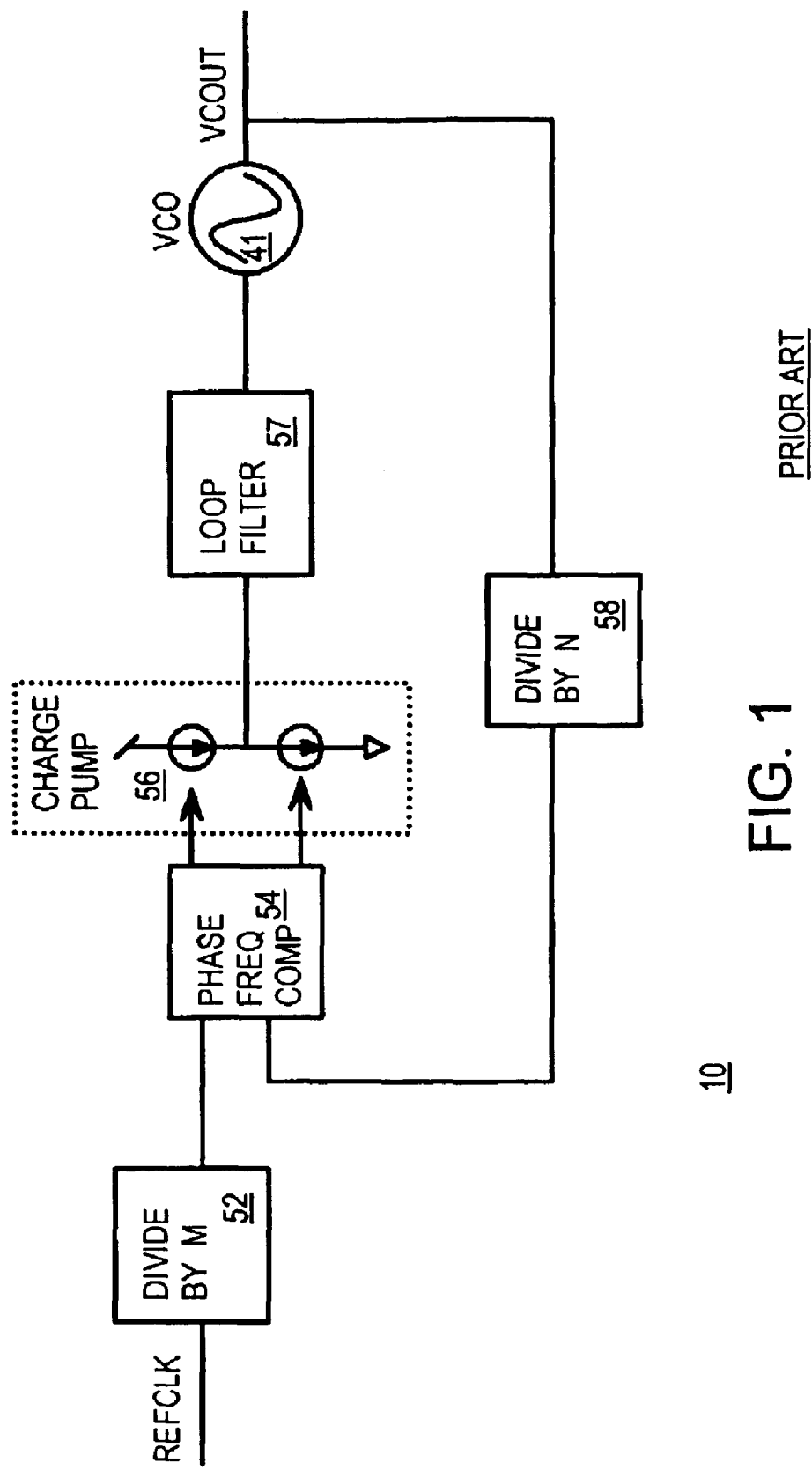
FIG. 1 shows a prior-art PLL.
Figure 2:
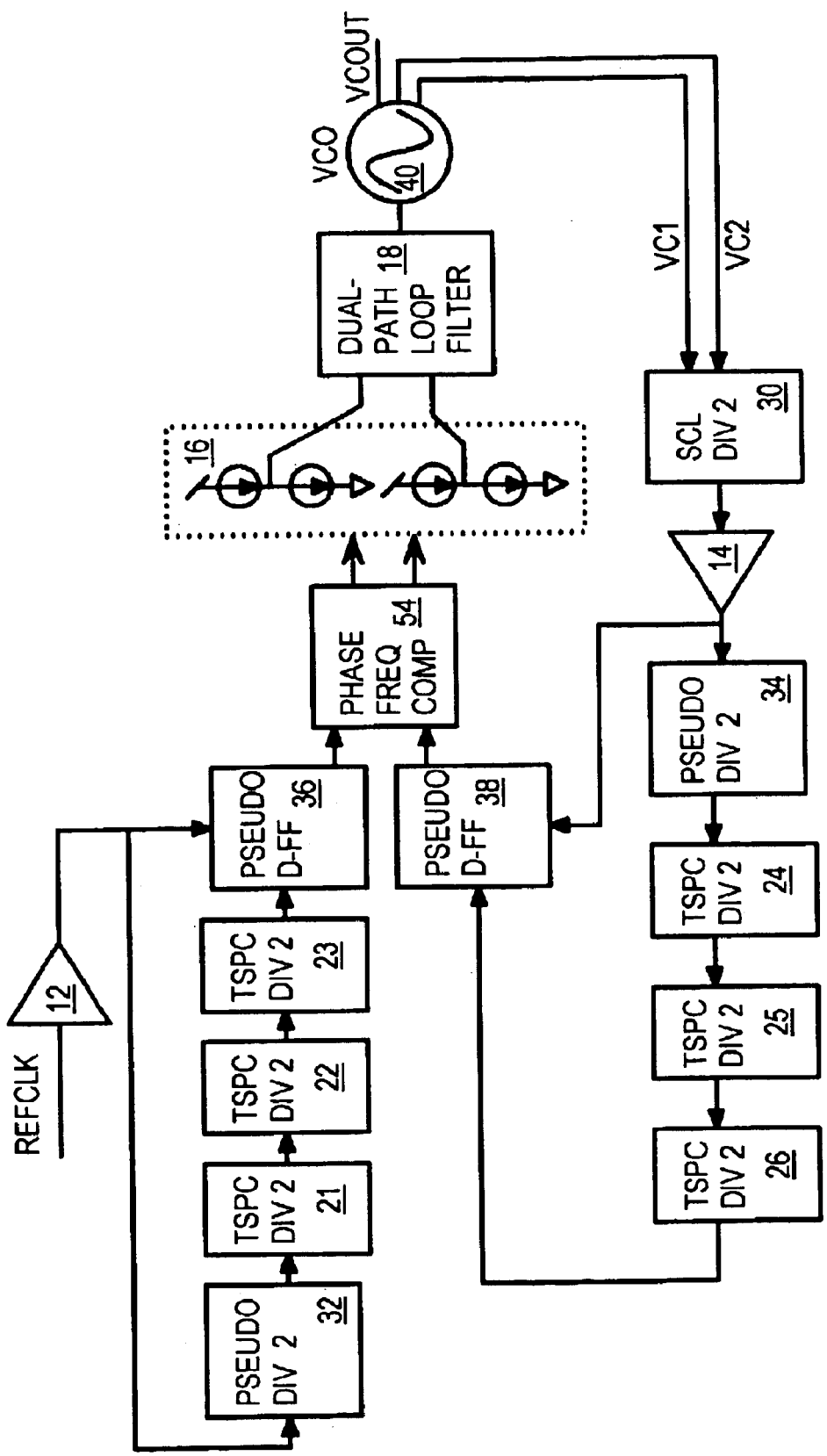
FIG. 2 shows a PLL with both analog and digital phase pre-alignment.

FIG. 2 shows a PLL with both analog and digital phase pre-alignment. High-frequency phase alignment is achieved by the use of an oscillator with multiple-phase outputs and a synchronous high-frequency divider. Phase-frequency detector 54 controls charge pump 16 which charges or discharges loop filter 18 in response to phase differences between the feedback and input paths detected by phase-frequency detector 54. Dual paths can be used for loop filter 18 and charge pump 16.

The voltage of loop filter 18 that is adjusted by phase differences is a control voltage VCTL fed in to VCO 40. This control voltage adjusts the frequency of oscillation of VCO 40, which can be an inductance-capacitance (LC) type of oscillator. Multiple phases of this output frequency are generated by VCO 40, such as four phases that are 90 degrees out of phase with each other, at 0, 90, 180, and 270 degrees.

Two of these phases are fed back as clocks to source-coupled-logic SCL divider 30. SCL divider 30 is an analog divider that receives two phases that are 180 degrees out of phase with one another from VCO 40. For example, VC1 can be at 0 degrees while VC2 is 180 degrees. SCL divider 30 performs an initial divide by two and generates four outputs offset in phase by 90 degrees from one another. One of these outputs inherently has the same phase as the VCO output and is selected to drive buffer 14 for phase alignment. The output of buffer 14 is applied as inputs to both pseudo D-flip-flop 38 and pseudo divider 34.

While VCO 40 and SCL divider 30 operate in the analog domain, the remaining dividers operate in the digital domain. Clock buffer 14 amplifies the analog output from SCL divider 30 to generate rail-to-rail digital signals, converting analog signals to digital signals.

The digital output from clock buffer 14 operates at half the frequency of VCOUT since its was divided by SCL divider 30. This digital signal from clock buffer 14 is applied to the clock input of pseudo D-flip-flop 38. A pseudo D-flip-flop with fewer cascode devices is used to achieve higher speed at a low power supply voltage with low power consumption. The D input to pseudo D-flip-flop 38 is the final output of a cascade of dividers 34, 24, 25, 26. Each of these dividers divides its input frequency by two, so the D input is a factor of 16 slower than the clock to pseudo D-flip-flop 38. Pseudo D-flip-flop 38 re-aligns the D input with the higher speed digital clock.

The first divider in the cascade chain, pseudo divider 34, uses ratioed logic to emulate the divide by two function. The remaining dividers 24, 25, 26 operate at successively lower frequencies and are designed to conserve power. These are true single-phase-clock (TSPC) digital circuits with a master and a slave that are both clocked. The divide by two function is performed by feeding the Q-bar output of the slave back to the D input of the master. The Q output of the slave is fed to the clock input of the next divider in the cascade.

A matching cascaded of digital dividers is provided for the reference clock path. The reference clock is buffered by clock buffer 12 which is designed and preferably physically laid out to match clock buffer 14 in electrical characteristics. The buffered reference clock is applied as the clock input to pseudo D-flip-flop 36 and to pseudo divider 32, the first divider in the cascade of dividers 32, 21, 22, 23, which match the feedback path's cascade of dividers 34, 24, 25, 26. The final Q output of divider 23 is fed to the D input of pseudo D-flip-flop 36 to be re-aligned with the buffered reference clock.

Both inputs to phase-frequency detector 54 are re-aligned by pseudo D-flip-flops but operate at one-sixteenth the frequency of the reference clock. The reference clock is re-aligned by pseudo D-flip-flop 36 while the divided-by-two feedback clock from SCL divider 30 is re-aligned by pseudo D-flip-flop 38.

For digital circuits, to achieve low power consumption and low voltage operation of PLL design, the high-frequency signals can be divided down to a lower frequency to relax the requirements of phase-frequency detector 54 and charge pump 16. However, the reference divider and feedback divider may not have the same intrinsic delay. As a result, it may create a phase offset between the input clock and the PLL output. To solve this ambiguity, two D flip-flops 36, 38 are inserted at the two inputs of phase-frequency detector 54. One pseudo-divider D flip-flop 36 is triggered by the input clock while the other pseudo-divider pseudo D-flip-flop 38 is triggered by the output of the first high-frequency divider in the feedback path. It should be noted that not only their output phases are aligned to their corresponding sampling clocks but that the their output frequencies are also unchanged and remain the same as the frequencies of the divided clock signals. This helps the loop to acquire stable locking.

Figure 3:
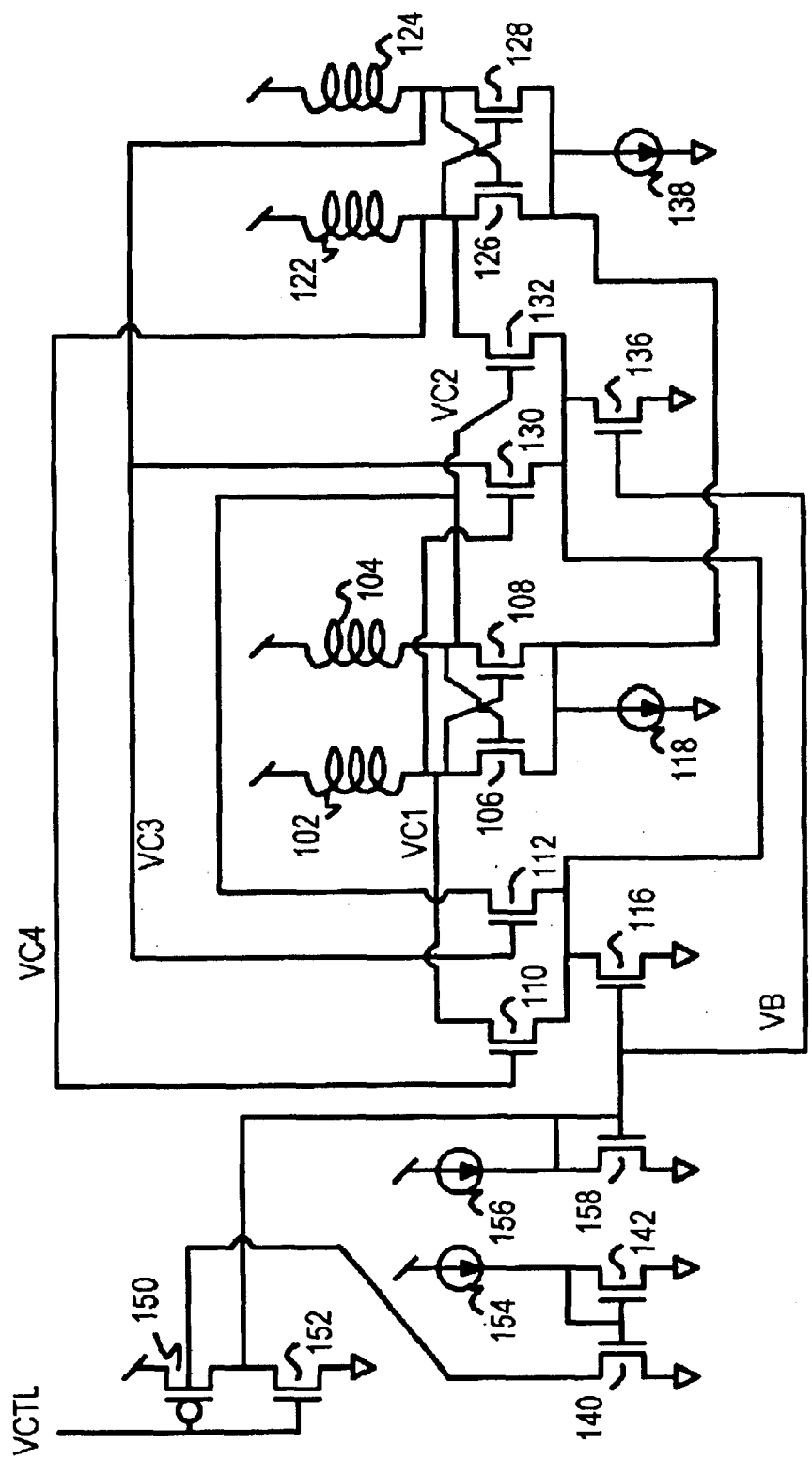
FIG. 3 is a schematic of a quadrature VCO.

To implement PLL 20 with the phase alignment technique, VCO 40 can be implemented with low-jitter, low-voltage coupled-LC oscillators with quadrature outputs. FIG. 3 is a schematic of a quadrature VCO. VCO 40 can generate four clock phases that are 0°, 90, 180 and 270 degrees out of phase from each other, respectively.

Two identical LC oscillators are coupled to each other and have their outputs oscillating at 90 degrees out of phase. Inductor 102 connects to n-channel transistor 106 with output node VC1 in between, while inductor 104 connects to n-channel transistor 108 with output node VC2 in between. The source currents of transistors 106, 108 are collected by current sink 118. The gates of transistors 106, 108 are cross-coupled to the other's drain to induce oscillation.

For the other LC oscillator, inductor 122 connects to n-channel transistor 126 with output node VC4 in between, while inductor 124 connects to n-channel transistor 128 with output node VC3 in between. The source currents of transistors 126, 128 are collected by current sink 138. The gates of transistors 126, 128 are cross-coupled to the other's drain.

The sources of transistors 106, 108, 126, 128 are all connected together. Further feedback is provided by applying VC1 to the gate of coupling transistor 130 and the drain of coupling transistor 110, applying VC2 to the gate of coupling transistor 132 and the drain of coupling transistor 112, applying VC3 to the gate of coupling transistor 112 and the drain of coupling transistor 130, applying VC4 to the gate of coupling transistor 110 and the drain of coupling transistor 132.

Since low supply voltage leads to limited control voltage and frequency tuning range, frequency tuning is not done by P-N junctions or MOS capacitors. Instead, frequency tuning is based on varying the tranconductances of coupling transistors 110, 112, 130, 132 which have sources connected to current source transistors 116, 132 which are controlled by bias voltage VB. Bias voltage VB varies with the VCO's input control voltage VCTL since VB is taken from the drains of tuning transistors 150, 152 which receive the VCO's input control voltage VCTL on their gates.

Tuning transistors 150, 152 help to achieve rail-to-rail frequency tuning. However, when control voltage VCTL is in the middle of the supply range, the VCO gain becomes non-linear because the two transistors operate in weak inversion. In order to compensate for this non-linearity, the threshold voltage of p-channel tuning transistor 150 is lowered by using a current-driven-bulk technique. The bulk or substrate terminal of p-channel tuning transistor 150 is driven by the drain of n-channel transistor 140, which has its gate mirrored by transistor 142. Current source 154 supplied current to transistor 142, while current source 156 supplies current to n-channel transistor 158, which has its gate and drain connected to bias voltage VB.

Outputs VC1, VC2, VC3, VC4 are multi-phase quadrature outputs offset in phase by 90 degrees. All have the output frequency that is adjusted by VCTL. In this particular example, the output phases for VC1, VC2, VC3, and VC4 are 0, 180, 270, and 90 degrees, respectively. PLL outputs can be taken from one of the multi-phase quadrature clocks or generated from a pair of the multi-clocks, such as the pair not used by SCL divider 30.

Figure 4:
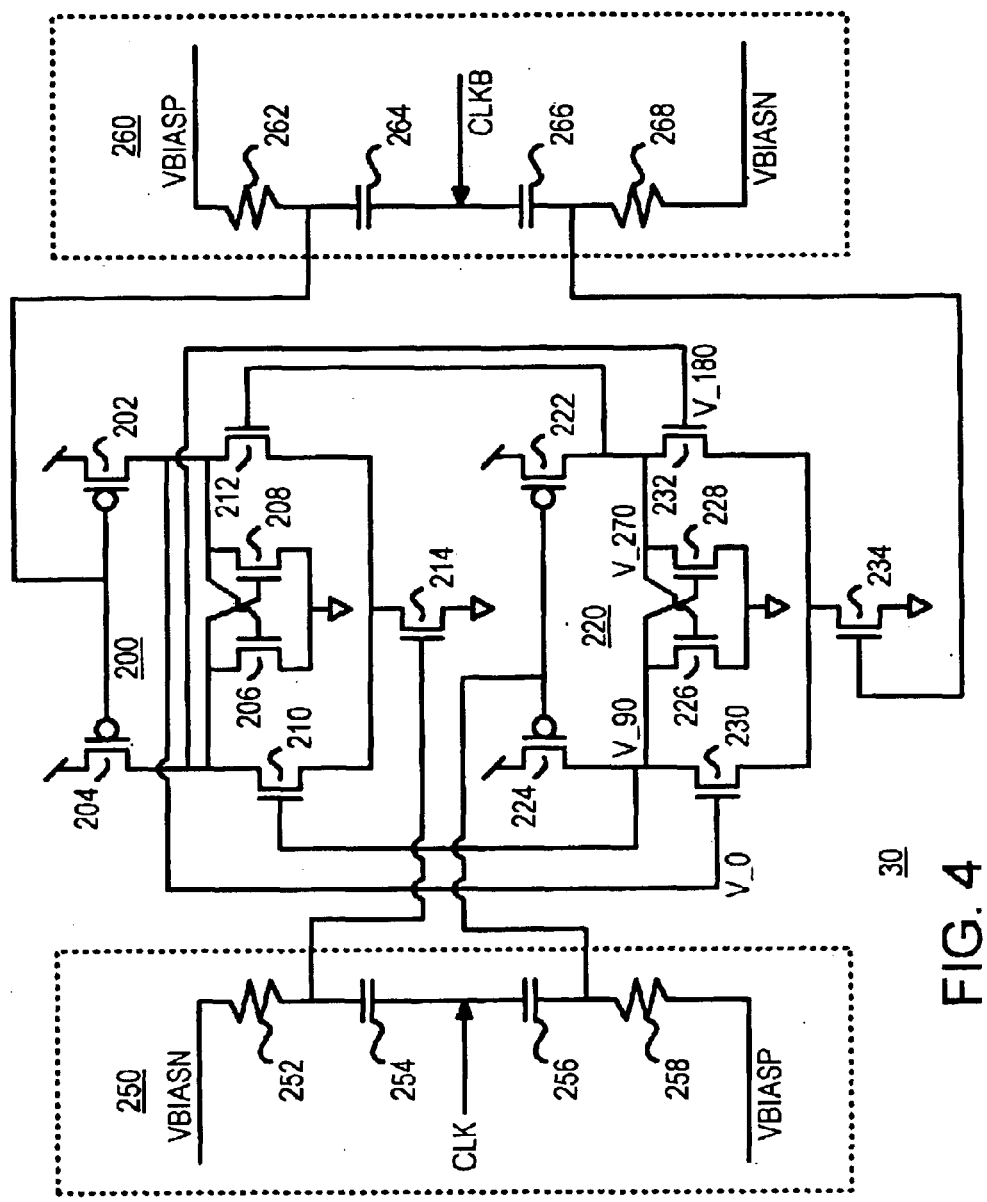
FIG. 4 is a diagram of the analog SCL divider.

FIG. 4 is a diagram of the analog SCL divider. Two of the quadrature outputs from the VCO that are inverses of each other are applied as inputs CLK, CLKB. Voltage divider 250 includes resistor 252, capacitor 254, capacitor 256, and resistor 258 in series between bias voltages VBIASN and VBIASP. The CLK input is applied between capacitors 254, 256, while a lower bias to the gate of n-channel source transistor 214 is taken from between capacitor 254 and resistor 252, while another bias to the gates of p-channel transistors 222, 224 is taken from between capacitor 256 and resistor 258. A similar voltage divider 260 receives CLKB, VIASP and VBIASN and biased p-channel transistors 202, 204 and n-channel transistor 234.

SCL divider 30 is a divide-by-2 circuit constructed from two identical source-coupled-logic (SCL) D-flip-flops, which are cross-coupled with each other. One flip-flop includes cross-coupled n-channel transistors 206, 208 with grounded sources, and one drain connected between p-channel transistor 204 and n-channel transistor 210, while the other drain connects between p-channel transistor 202 and n-channel transistor 212. The other flip-flop includes cross-coupled n-channel transistors 226, 228 with grounded sources, and one drain connected between p-channel transistor 224 and n-channel transistor 230, while the other drain connects between p-channel transistor 222 and n-channel transistor 232.

The two flip-flops are connected together by output node V_0, the drain of transistor 212, connecting to the gate of n-channel transistor 230, output node V_90, the drain of transistor 230, connecting to the gate of n-channel transistor 210, output node V_180, the drain of transistor 210, connecting to the gate of n-channel transistor 232, and output node V_270, the drain of transistor 232, connecting to the gate of n-channel transistor 212.

Direct coupling and cross coupling of the D flip-flops in the divider enables the output signals V_0, V_90, V_180, and V_270 to achieve four quadrature phases, which are 90° different in phase from each other.

Moreover, to enable SCL divider 30 to operate at a high frequency under a low voltage supply (as low as 1V) in a standard CMOS process with devices' threshold voltages around 0.5V, both dynamic loads of transistors 202, 204, 214, 222, 224, 234, and AC-coupling circuits of capacitors 254, 256, 264, 266 are employed as illustrated.

SCL divider 30 is biased in the current-limited regime so that the output swing is limited. Such a limited swing not only increases the speed but also ensures a non-clipping sinusoidal output waveform, which helps to achieve phase alignment with its sinusoidal input from VCO 40. Such a sinusoidal waveform has its highest slew rate at the rising edge or falling edges, which are aligned with the peak of the input signals from the VCO. Since the operating frequency of the divider is half the frequency of the oscillator in the locked state, if the In-Phase (0 degree output) of the oscillator is connected to SCL divider 30, the peak of the In-Phase signal of the oscillator is at the rising edge or falling edge of the In-Phase signal of SCL divider 30. Consequently, both Quadrature-Phase outputs of the oscillator and divider achieve an inherent phase alignment.

Figure 5:
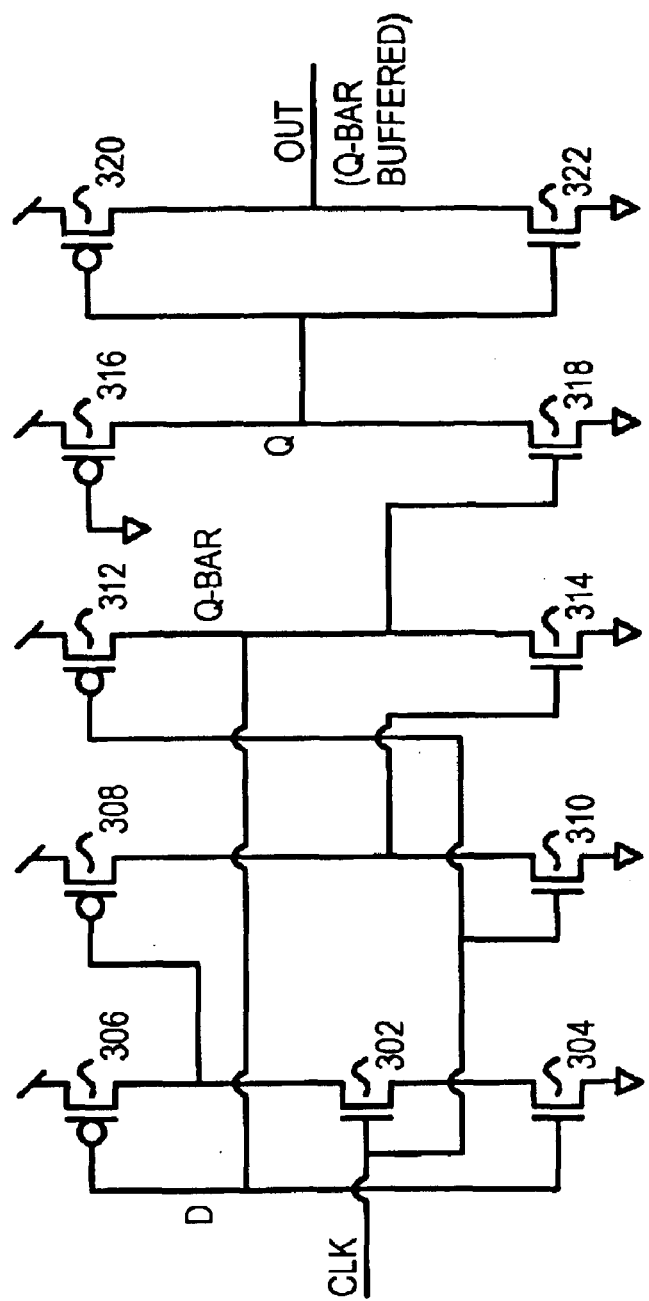
FIG. 5 is a diagram of a pseudo divider.

FIG. 5 is a diagram of a pseudo divider. Pseudo divider 32 is a pseudo flip-flop with its Q-bar output connected back to its D input to form a divided-by-two circuit. The clock input is buffered from the analog output of SCL divider 30 by the clock buffer, or is a digital Q output from an upstream digital divider.

The CLK input from the upstream divider or clock buffer is applied to the gates of n-channel transistor 302, 310 in stages 1, 2 and p-channel transistor 312 in stage 3. A first clocked inverter is formed by p-channel transistor 306, n-channel transistor 304, which receive Q-bar at their gates, and n-channel clock transistor 302. When CLK goes high, Q-bar is inverted to drive the gate of p-channel transistor 308 in stage 2. Transistors 308, 310 in stage 2 form the second inverter in the slave and drive the gate of p-channel transistor 312 in stage 3.

When CLK goes low again, p-channel transistor 312 turns on, and together with n-channel transistor 314 connected to the output of stage 2 invert the signal to generate Q-bar back to stage 1. Q-bar is inverted by transistors 316, 318 to generate Q and again by transistors 320, 322 to generate OUT (buffered Q-bar) to the next divider in the cascade.

Figure 6:
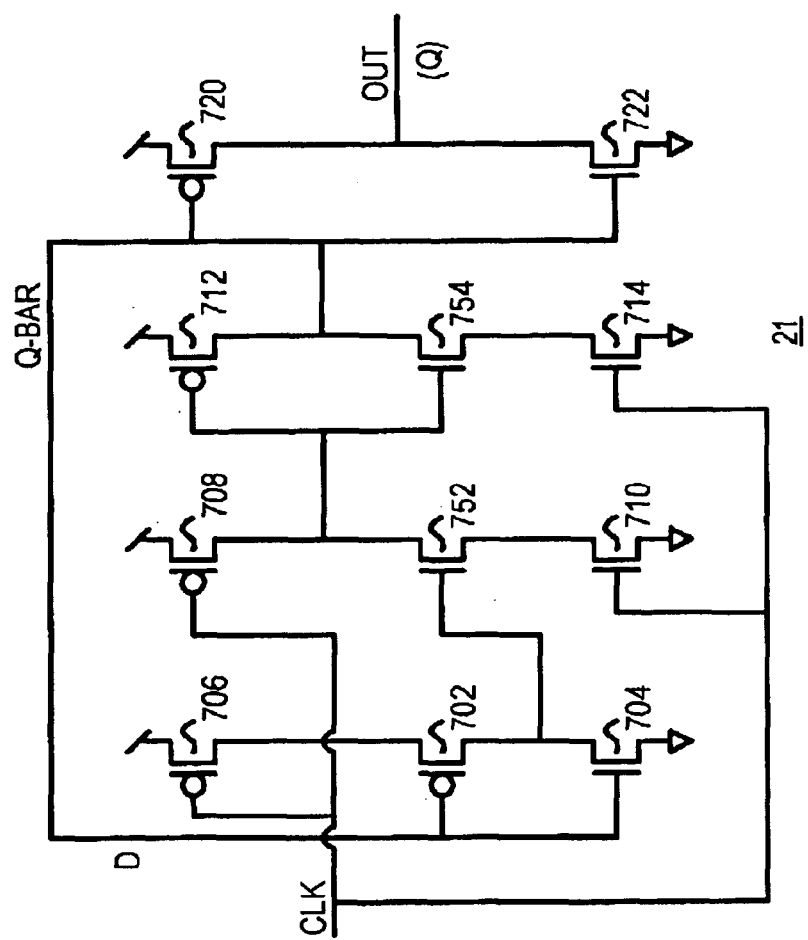
FIG. 6 shows a true-single-phase-clock TSPC divider.

FIG. 6 shows a true-single-phase-clock TSPC divider. Divider 21 uses a more fully-complementary metal-oxide-semiconductor (CMOS) approach to reduce power consumption for the dividers that operate at lower frequency. Source p-channel transistors 706, 708 have gates driven by CLK and activate inverters of transistors 702, 704, that receive the Q-bar to D feedback at their gates, and which drive the gates of transistors 752, 710. The Q-bar feedback is generated by the third stage of transistors 712, 754, 714, which also drive the final buffer of transistors 720, 722. N-channel transistors 710, 714 in the second and third stages also receive CLK on their gates.

Figure 7:
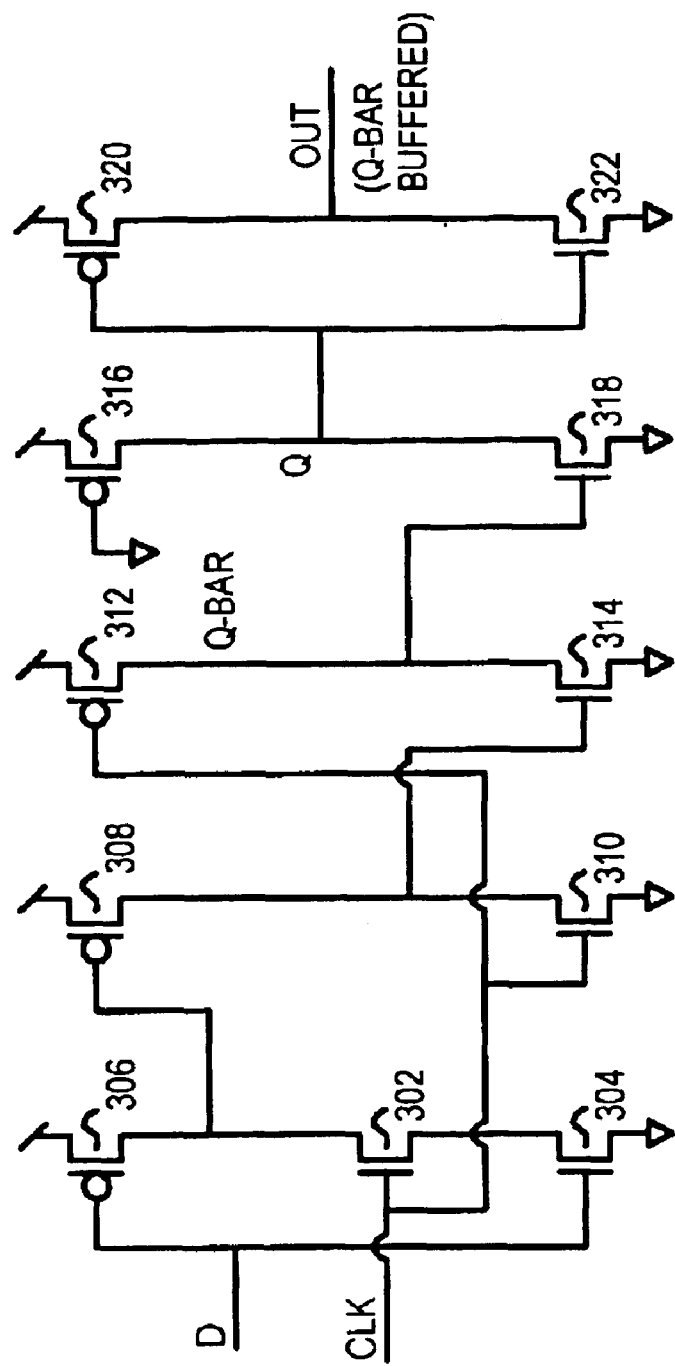
FIG. 7 shows a pseudo D-flip-flop.

FIG. 7 shows a pseudo D-flip-flop. Pseudo D-flip-flop 38 is similar to the circuit of FIG. 5, except that the feedback from stage 3 (un-buffered Q-bar) is broken. Instead a separate D input is received. This D input comes from the final divider in the cascade of dividers, while the clock CLK comes from the clock buffer, and is the input to the cascade of dividers.

Combining both analog and digital phase alignment circuitries, the PLL design can work at low voltage, perform clock synthesis, and generate high frequency clock signals.

Alternate Embodiments

Several other embodiments are contemplated by the inventors. For example other analog and digital circuit implementations are possible. The VCO oscillator can be implemented by a ring oscillator design with a cascade of several delay cells to form an unstable loop or using coupled LC oscillators with quadrature outputs. The loop filter can include a capacitor to ground or to another fixed voltage, and can include a series resistance. More complex filter networks are possible. Simple single-path charge pumps and loop filters could be used.

The analog divider could use other analog logic other than SCL. The analog and/or digital divider could divide by more than two. More complex logic could be substituted, and additional logic and circuits could be added, such as for reset and power down. Other kinds of dividers could be used, and other kinds of flip-flops such as toggle, S-R, J-K can be substituted.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC A§ 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A phase-aligning phase-locked loop (PLL) comprising:
   a phase-frequency detector having a reference input and a feedback input, for determining phase differences between the reference input and the feedback input;
   a loop filter for generating a control voltage;
   a charge pump, controlled by the phase-frequency detector, for charging and discharging the loop filter to adjust the control voltage;
   a voltage-controlled oscillator (VCO) generating multi-phase output clocks having an output frequency controlled by the control voltage from the loop filter;
   an analog divider, receiving at least two of the multi-phase output clocks from the VCO, and generating a divided analog feedback clock having a feedback frequency that is the output frequency divided by a positive power of two;
   a clock buffer, receiving the divided analog feedback clock, for generating a digital feedback clock;
   a feedback digital divider, receiving the digital feedback clock, for generating a final feedback clock having a final feedback frequency that is the feedback frequency divided by a positive power of two; and
   a feedback flip-flop, receiving the final feedback clock and clocked by the digital feedback clock, for generating a phase-aligned feedback clock to the feedback input of the phase-frequency detector;
   whereby the analog divider and digital divider are in a feedback path.

2. The phase-aligning phase-locked loop of claim 1 further comprising:
   a reference digital divider, receiving a reference clock having a reference frequency, for generating a final reference clock having a final reference frequency that is the reference frequency divided by a positive power of two;
   a reference flip-flop, receiving the final reference clock and clocked by the reference clock, for generating a phase-aligned reference clock to the reference input of the phase-frequency detector.

3. The phase-aligning phase-locked loop of claim 2 wherein the feedback digital divider comprises a first cascade of digital dividers in series, each of the digital dividers dividing by two or a power of two.

4. The phase-aligning phase-locked loop of claim 3 wherein the reference digital divider comprises a second cascade of digital dividers in series, each of the digital dividers dividing by two or a power of two;
   wherein the first cascade of dividers divides by a same divisor as the second cascade of dividers; whereby the reference clock and the digital feedback clock are divided by a same divisor.

5. The phase-aligning phase-locked loop of claim 4 wherein each digital divider is a flip-flop clocked by an output of an upstream digital divider or by the digital feedback clock.

6. The phase-aligning phase-locked loop of claim 5 wherein each digital divider is a D-type flip-flop having a D input receiving a Q-bar signal from within the digital divider.

7. The phase-aligning phase-locked loop of claim 2 wherein the analog divider is a source-coupled-logic SCL divider.

8. The phase-aligning phase-locked loop of claim 7 wherein the multi-phase output clocks are coupled to inputs of the analog divider through capacitors to gates of dynamic-load transistors of cross-coupled flip-flops.

9. The phase-aligning phase-locked loop of claim 2 wherein the feedback flip-flop is a D-type flip-flop with a D-input receiving the final feedback clock;
   wherein the reference flip-flop is a D-type flip-flop with a D-input receiving the final reference clock.

10. The phase-aligning phase-locked loop of claim 2 wherein the VCO is an inductance-capacitance LC oscillator having four in-phase and quadrature-phase output clocks that are offset from each other by 90 degrees.

11. The phase-aligning phase-locked loop of claim 10 wherein the VCO comprises:
    a first LC oscillator having:
    a first true inductor and a first complement inductor;
    a first pair of cross-coupled transistors including a first true cross transistor connected to the first true inductor and a first complement cross transistor connected to the first complement inductor;
    a first current source coupled to the first pair of cross-coupled transistors;
    a second LC oscillator having:
    a second true inductor and a second complement inductor;
    a second pair of cross-coupled transistors including a second true cross transistor connected to the second true inductor and a second complement cross transistor connected to the second complement inductor;
    a second current source coupled to the second pair of cross-coupled transistors;
    a first true coupling transistor, having a gate connected to the second true inductor and the second true cross transistor;
    a first complement coupling transistor, having a gate connected to the second complement inductor and the second complement cross transistor;
    a first adjustable source transistor, coupled to sources of the first true coupling transistor and the first complement coupling transistor and having a gate controlled by a bias voltage;
    a second true coupling transistor, having a gate connected to the second true inductor and the second true cross transistor;
    a second complement coupling transistor, having a gate connected to the first complement inductor and the first complement cross transistor;
    a second adjustable source transistor, coupled to sources of the first true coupling transistor and the first complement coupling transistor and having a gate controlled by the bias voltage; and a bias-voltage generator, receiving the control voltage from the loop filter, for generating the bias voltage.

12. The phase-aligning phase-locked loop of claim 11 wherein the bias-voltage generator comprises:

a p-channel bias transistor having a gate that receives the control voltage;

an n-channel bias transistor having a gate that receives the control voltage;

wherein drains of the p-channel bias transistor and the n-channel bias transistor are connected together to generate the bias voltage.

13. The phase-aligning phase-locked loop of claim 12 wherein a substrate terminal of the p-channel bias transistor is driven by a n-channel bulk transistor.

14. The phase-aligning phase-locked loop of claim 2 wherein the final feedback frequency is no more than one-sixteenth of the feedback frequency.

15. The phase-aligning phase-locked loop of claim 14 wherein the digital feedback clock has the feedback frequency.

16. The phase-aligning phase-locked loop of claim 15 wherein the charge pump is a dual-path charge pump driving a dual loop filter.

17. A phase-locked loop (PLL) comprising:

a phase-frequency detector with a reference input and a feedback input;

a feedback flip-flop having a feedback data input and a feedback clock input, for driving the feedback input to the phase-frequency detector;

a loop filter for generating a control voltage;

a charge pump, activated by the phase-frequency detector, for driving the loop filter;

a quadrature voltage-controlled oscillator (VCO), coupled to the control voltage, generating four phases of an output clock having an output frequency;

an analog divider receiving two of the four phases of the output clock, and generating an analog feedback clock;

a buffer receiving the analog feedback clock, and driving a feedback clock input to the feedback flip-flop;

a feedback series of digital flip-flops for driving the feedback data input to the feedback flip-flop, and coupled to the buffer;

a reference flip-flop having a reference data input and a reference clock input, for driving the reference input to the phase-frequency detector;

a reference series of digital flip-flops for driving the reference data input to the reference flip-flop, and coupled to a reference clock.

18. The PLL of claim 17 wherein the analog divider comprises:

a first analog flip-flop having a first pair of source transistors and a first sink transistor;

a second analog flip-flop having a second pair of source transistors and a second sink transistor;

wherein the first and second analog flip-flops are cross-coupled;

a first voltage divider, receiving a high bias voltage and a low bias voltage and a first phase clock being one of the two of the four phases of the output clock received from the quadrature voltage-controlled oscillator, having a first capacitor between the first phase clock and gates of the second pair of source transistors and a second capacitor between the first phase clock and a gate of the first sink transistor, and a first resistor between the low bias voltage and the first capacitor and a second resistor between the high bias voltage and the second capacitor; and a second voltage divider, receiving the high bias voltage and the low bias voltage and a second phase clock being one of the two of the four phases of the output clock received from the quadrature voltage-controlled oscillator, having a third capacitor between the second phase clock and gates of the first pair of source transistors and a fourth capacitor between the second phase clock and a gate of the second sink transistor, and a third resistor between the high bias voltage and the third capacitor and a fourth resistor between the low bias voltage and the fourth capacitor.

19. A phase-aligner phase-locked loop (PLL) comprising:

phase-frequency detect means, having a reference input and a feedback input, for comparing phases of clocks applied to the reference input and to the feedback input;

feedback flip-flop means, having a feedback data input and a feedback clock input, for driving the feedback input to the phase-frequency detect means;

loop filter means for generating a control voltage;

charge pump means, activated by the phase-frequency detect means, for driving the loop filter means;

quadrature voltage-controlled oscillator means for generating four phases of an output clock having an output frequency in response to the control voltage;

analog divider means, receiving two of the four phases of the output clock, for generating an analog feedback clock;

buffer means, receiving the analog feedback clock, for driving a feedback clock input to the feedback flip-flop means;

feedback series means for driving the feedback data input to the feedback flip-flop means with a divided-down frequency clock, and coupled to the buffer means;

reference flip-flop means, having a reference data input and a reference clock input, for driving the reference input to the phase-frequency detect means;

reference series means for driving the reference data input to the reference flip-flop means with a divided-down frequency clock, and coupled to a reference clock.

20. The phase-aligner phase-locked loop of claim 19 wherein delays through the feedback series means matches delays through the reference series means;

wherein delays through the feedback flip-flop means matches delays through the reference flip-flop means.

* * * * *